US010290620B2

(12) United States Patent
Bruno et al.

(10) Patent No.: US 10,290,620 B2
(45) Date of Patent: *May 14, 2019

(54) PACKAGE WITH SOC AND INTEGRATED MEMORY

(71) Applicant: Apple Inc., Cupertino, CA (US)

(72) Inventors: John Bruno, San Jose, CA (US); Jun Zhai, San Jose, CA (US); Timothy J. Millet, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 68 days.

This patent is subject to a terminal disclaimer.

(21) Appl. No.: 15/420,594

(22) Filed: Jan. 31, 2017

(65) Prior Publication Data

US 2017/0141095 A1 May 18, 2017

Related U.S. Application Data

(63) Continuation of application No. 15/087,200, filed on Mar. 31, 2016, now Pat. No. 9,595,514, which is a
(Continued)

(51) Int. Cl.
*H01L 25/18* (2006.01)
*H01L 25/16* (2006.01)
(Continued)

(52) U.S. Cl.
CPC ............. *H01L 25/18* (2013.01); *H01L 23/13* (2013.01); *H01L 23/367* (2013.01);
(Continued)

(58) Field of Classification Search
CPC ....... H01L 25/16; H01L 23/13; H01L 23/367; H01L 2924/19041; H01L 23/49833;
(Continued)

(56) References Cited

U.S. PATENT DOCUMENTS 6,127,726 A    10/2000  Bright
6,296,048 B1 * 10/2001  Sauer .................. H01L 21/4882
                                                            165/185
(Continued)

*Primary Examiner* — Anthony M Haughton
*Assistant Examiner* — Yahya Ahmad
(74) *Attorney, Agent, or Firm* — Meyertons, Hood, Kivlin, Kowert & Goetzel, P.C.; Gareth M. Sampson; Lawrence J. Merkel

(57) ABSTRACT

A semiconductor package includes a processor die (e.g., an SoC) and one or more memory die (e.g., DRAM) coupled to a ball grid array (BGA) substrate. The processor die and the memory die are coupled to opposite sides of the BGA substrate using terminals (e.g., solder balls). The package may be coupled to a printed circuit board (PCB) using one or more terminals positioned around the perimeter of the processor die. The PCB may include a recess with at least part of the processor die being positioned in the recess. Positioning at least part of the processor die in the recess reduces the overall height of the semiconductor package assembly. A voltage regulator may also be coupled to the BGA substrate on the same side as the processor die with at least part of the voltage regulator being positioned in the recess a few millimeters from the processor die.

20 Claims, 2 Drawing Sheets

Related U.S. Application Data continuation of application No. 14/097,491, filed on Dec. 5, 2013, now Pat. No. 9,331,058.

(51) Int. Cl.
| | | |
|---|---|---|
| *H01L 23/13* | (2006.01) | |
| *H01L 23/367* | (2006.01) | |
| *H05K 1/02* | (2006.01) | |
| *H05K 1/14* | (2006.01) | |
| *H01L 23/538* | (2006.01) | |
| *H01L 25/065* | (2006.01) | |
| *H01L 25/10* | (2006.01) | |
| *H05K 1/18* | (2006.01) | |

(52) U.S. Cl.
CPC ...... *H01L 23/3675* (2013.01); *H01L 23/5385* (2013.01); *H01L 23/5386* (2013.01); *H01L 23/5389* (2013.01); *H01L 25/0652* (2013.01); *H01L 25/105* (2013.01); *H01L 25/16* (2013.01); *H05K 1/0204* (2013.01); *H05K 1/141* (2013.01); *H05K 1/144* (2013.01); *H01L 2224/134* (2013.01); *H01L 2224/13124* (2013.01); *H01L 2224/13411* (2013.01); *H01L 2224/16225* (2013.01); *H01L 2224/73204* (2013.01); *H01L 2224/73253* (2013.01); *H01L 2225/06517* (2013.01); *H01L 2225/06572* (2013.01); *H01L 2225/06589* (2013.01); *H01L 2225/1023* (2013.01); *H01L 2225/1058* (2013.01); *H01L 2225/1094* (2013.01); *H01L 2924/1205* (2013.01); *H01L 2924/1206* (2013.01); *H01L 2924/1207* (2013.01); *H01L 2924/1427* (2013.01); *H01L 2924/1432* (2013.01); *H01L 2924/1436* (2013.01); *H01L 2924/15153* (2013.01); *H01L 2924/15311* (2013.01); *H01L 2924/15321* (2013.01); *H01L 2924/19041* (2013.01); *H01L 2924/19042* (2013.01); *H01L 2924/19043* (2013.01); *H01L 2924/19105* (2013.01); *H05K 1/181* (2013.01); *H05K 2201/09036* (2013.01); *H05K 2201/10416* (2013.01); *H05K 2201/10734* (2013.01)

(58) Field of Classification Search
CPC ...... H05K 1/141; H05K 1/0204; H05K 1/144; H05K 2201/10416; H05K 2201/09036; H05K 1/183; H05K 2201/10507; H05K 2201/10734; G06F 1/18; G06F 1/189
USPC ...................................... 361/679.31, 688–723
See application file for complete search history.

(56) References Cited

U.S. PATENT DOCUMENTS

| | | | |
|---|---|---|---|
| 6,580,611 | B1 * | 6/2003 | Vandentop .......... H01L 23/4006 165/185 |
| 6,678,167 | B1 | 1/2004 | Degani |
| 7,112,884 | B2 | 9/2006 | Bruno |
| 8,193,635 | B2 | 6/2012 | Bruno |
| 9,331,058 | B2 * | 5/2016 | Bruno ..................... H01L 25/16 |
| 9,595,514 | B2 * | 3/2017 | Bruno ..................... H01L 25/16 |
| 2002/0074668 | A1 * | 6/2002 | Hofstee ............... H01L 23/3677 257/777 |
| 2005/0117296 | A1 * | 6/2005 | Wu ..................... H01L 23/4093 361/697 |
| 2006/0043581 | A1 * | 3/2006 | Prokofiev ......... H01L 23/49838 257/713 |
| 2006/0095621 | A1 | 5/2006 | Vinogradov |
| 2008/0007925 | A1 * | 1/2008 | Kariya .............. H01L 23/49822 361/760 |
| 2008/0116589 | A1 * | 5/2008 | Li ........................ H01L 21/563 257/780 |
| 2008/0142961 | A1 * | 6/2008 | Jones .................... H01L 25/165 257/724 |
| 2010/0103604 | A1 * | 4/2010 | Jafari ..................... G06F 1/183 361/679.31 |
| 2012/0049365 | A1 * | 3/2012 | Ko ......................... H01L 23/13 257/738 |
| 2012/0217614 | A1 * | 8/2012 | Burgyan ............... H01L 23/057 257/531 |
| 2013/0277865 | A1 | 10/2013 | Teh |
| 2014/0077349 | A1 * | 3/2014 | Higgins, III .......... H01L 21/565 257/692 |
| 2014/0293563 | A1 * | 10/2014 | Loo ..................... H01L 25/0652 361/767 |
| 2015/0255441 | A1 * | 9/2015 | Lamorey ................ H01L 25/18 257/704 |
| 2016/0218094 | A1 | 7/2016 | Bruno et al. |

\* cited by examiner

PACKAGE WITH SOC AND INTEGRATED MEMORY

PRIORITY CLAIM

This application is a continuation of U.S. patent application Ser. No. 15/087,200, entitled "Package with SoC and Integrated Memory," filed Mar. 31, 2016, which is a continuation of U.S. patent application Ser. No. 14/097,491 (now U.S. Pat. No. 9,331,058), entitled "Package with SoC and Integrated Memory," filed Dec. 5, 2013, each of which is hereby incorporated by reference in its entirety as though fully and completely set forth herein.

BACKGROUND

1. Technical Field

The present disclosure relates to semiconductor packaging and methods for packaging semiconductor devices. More particularly, the disclosure relates to a package assembly that includes a system on a chip (SoC) and memory die coupled to a BGA (ball grid array) substrate.

2. Description of Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "prestacking" or the integration of system on a chip ("SoC") technology with memory technology) allows for thinner packages to be coupled to printed circuit boards (PCBs). PoP packages, however, are still limited in the minimum thicknesses (z-heights) that may be achieved (e.g., current techniques may only achieve z-heights of about 1.2 to about 1.3 mm above the PCB).

In addition, PoP packages provide little to no thermal separation between the SoC and its associated memory die (e.g., DRAM die) because the memory die are stacked near the SoC. Because the SoC and its associated memory die are thermally coupled, heat generated from the SoC may heat the memory die and the memory die is slowed down (throttled) to inhibit overheating of the memory die. Additionally, heat generated from the memory die may heat the SoC because the SoC and its associated memory die are thermally coupled, thus slowing down the SoC. The issues with thermal coupling and thermal density between the SoC and the memory die may be further increased as z-height in PoP packages (or similarly stacked package topologies) is reduced. Because of these issues with PoP packages, potential advancements and/or design modifications are being developed to provide semiconductor package assemblies using SoCs that can reduce z-height (thickness) as well as provide improved thermal properties for the SoC and/or the memory die. Additional advancements are also being developed to integrate power delivery systems into the package assembly and improve signal integrity to memory die at higher speeds.

SUMMARY

In certain embodiments, semiconductor package includes a processor die (e.g., an SoC) and one or more memory die (e.g., DRAM) coupled to a ball grid array (BGA) substrate. The processor die may be coupled to a lower surface of the BGA substrate and the memory die may be coupled an upper surface of the BGA substrate. Coupling the processor die and the memory die on opposite sides of the BGA substrate thermally separates the die. The processor die and the memory die may be coupled to the BGA substrate using one or more terminals (e.g., solder balls). In some embodiments, a voltage regulator is coupled to the lower surface of the BGA substrate with the voltage regulator being at most about 5 mm from the processor die.

In certain embodiments, the package with the processor die and the memory die coupled to the BGA substrate is coupled to a printed circuit board (PCB). The package may be coupled to the PCB using one or more terminals positioned around the perimeter of the processor die. In certain embodiments, the PCB includes a recess in an upper surface of the PCB. At least a portion of the processor die and/or at least a portion of the voltage regulator may be positioned in the recess to reduce the overall height of the semiconductor package assembly.

In some embodiments, the memory die are coupled together in a memory die stack on the upper surface of the BGA substrate. Coupling the memory die in the stack provides an open area on the upper surface of the BGA substrate. The open area may be used for surface mounting of one or more passive elements used in a power delivery system.

BRIEF DESCRIPTION OF THE DRAWINGS

Features and advantages of the methods and apparatus of the disclosed embodiments will be more fully appreciated by reference to the following detailed description of presently preferred but nonetheless illustrative embodiments in accordance with the disclosure when taken in conjunction with the accompanying drawings in which.

Figure 1:
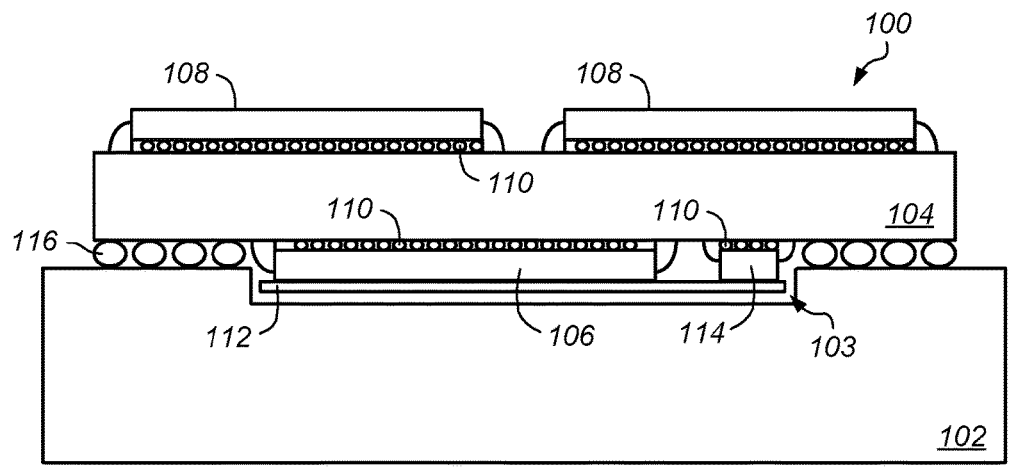
FIG. 1 depicts a side-view representation of an embodiment of a semiconductor package coupled to a board.

While the described embodiments is susceptible to various modifications and alternative forms, specific embodiments thereof are shown by way of example in the drawings and will herein be described in detail. The drawings may not be to scale. It should be understood that the drawings and detailed description thereto are not intended to limit the described embodiments to the particular form disclosed, but to the contrary, the intention is to cover all modifications, equivalents and alternatives falling within the spirit and scope of the these embodiments as defined by the appended claims.

DETAILED DESCRIPTION OF EMBODIMENTS

FIG. 1 depicts a side-view representation of an embodiment of semiconductor package 100 coupled to board 102. In certain embodiments, board 102 is a printed circuit board (PCB) such as a laminate structure PCB. For example, board 102 may include a multilayer laminate structure (e.g., multilayers of non-conductive and conductive layers laminated together). In some embodiments, board 102 is a motherboard or other board suitable for coupling to package 100. In certain embodiments, recess 103 is formed in an upper surface of board 102. Recess 103 may be formed, for example, by removing one or more layers from board 102.

In one embodiment, two layers of board 102 are removed to form recess 103. The layers removed to form recess 103 may be removed, for example, using etching techniques known in the art such as laser etching.

In certain embodiments, package 100 includes substrate 104, processor die 106, and one or more memory die 108. In certain embodiments, substrate 104 is a ball grid array (BGA) substrate (e.g., a flip-chip ball grid array substrate). Substrate 104 may include, for example, a laminate materials such as Bismaleimide Triazine (BT) laminate or another suitable laminate or ceramic material. Processor die 106 and memory die 108 may be coupled to substrate using terminals 110. Terminals 110 may be, for example, aluminum balls or balls of another suitable conductive material for use with a BGA. In some embodiments, terminals 110 are solder-coated or Sn-coated. Because processor die 106 and memory die 108 are directly coupled to substrate 104, terminals 110 may have a relatively fine pitch and a relatively large number of terminals are used for each of the processor die and the memory die. Using a relatively large number of terminals 110 for each die provides an increased number of input/outputs available for each die.

In certain embodiments, processor die 106 is a system on a chip ("SoC"). Processor die 106 may be, for example, an ASIC ("application specific integrated circuit") SoC. In certain embodiments, the SoC includes a graphics controller, a central processing unit, one or more hardware accelerators, one or more information routers, and/or a memory subsystem controller and fabric combined on processor die 106. Hardware accelerators may include, but not be limited to, video encoders/decoders and/or image processing accelerators. Information routers may include routers such as, but not limited to, a north bridge, a south bridge, or another integrated circuit capable of routing data between multiple locations.

Package 100 includes two (2) memory die in an embodiment of a typical package used, for example, in portable devices such as smartphones or tablets. In certain embodiments, memory die 108 are single layer memory die spaced apart on the upper surface of substrate 104, as shown in FIG. 1. Memory die 108 may be, for example, DRAM or other suitable memory integrated circuits. Memory die may be, however, any type of volatile or non-volatile storage die. In certain embodiments, memory die 108 are coupled as bare memory die on the upper surface of substrate 104 (e.g., the memory die are not encapsulated or enclosed in any other material). In addition, memory die 108 may be coupled to the upper surface of substrate 104 after substrate 104 is coupled to board 102. Coupling memory die 108 after coupling substrate 104 to board 102 allows the memory die to be tested separately from the substrate/processor die structure and for only passing memory die to be coupled to the substrate/processor die structure. Performing this "pre-screening" of memory die 108 allows a high volume throughput of memory die to be achieved and increases yield of package 100.

In certain embodiments, heat sink material 112 is coupled to a lower surface of processor die 106. Thus, when package 100 is coupled to board 102, heat sink material 112 is located between processor die 106 and the upper surface of the board. Heat sink material 112 may be any suitable thermal interface material that transfers heat from processor die 106 to board 102. For example, heat sink material 112 may be an interface material such as a thermal adhesive material, indium, or a liquid metal thermal interface material. In some embodiments, heat sink material 112 is an adhesive material that adhesively couples to processor die 106. Heat sink material 112 may, however, be formed on the lower surface of processor die 106 using techniques known in the art.

In some embodiments, voltage regulator 114 is coupled to the lower surface of substrate 104. Voltage regulator 114 may include components such as, but not limited to, inductors, capacitors, resistors, and other components used to provide power to package 100 (e.g., processor die 106 and memory die 108). Voltage regulator 114 may be spaced a selected distance from processor die 106. For example, voltage regulator 114 may be spaced from processor die 106 a small distance to reduce power transmission losses between the voltage regulator and the processor die. In one embodiment, voltage regulator 114 is at most about 5 mm from processor die 106. In some embodiments, voltage regulator 114 is at most about 7.5 mm or at most about 10 mm from processor die 106.

In some embodiments, heat sink material 112 is coupled to the lower surface of voltage regulator 114. Heat sink material 112 may be a continuous material coupled to the lower surface of both processor die 106 and voltage regulator 114, as shown in FIG. 1, or the heat sink material may include separate materials individually coupled to the lower surfaces of the processor die and the voltage regulator. Coupling voltage regulator 114 to substrate 104 provides voltage regulation on package 100, which allows the package to have the capability for generating all of its various power rails needed to function as a self-contained package.

In certain embodiments, substrate 104 is coupled to board 102 using terminals 116. Terminals 116 may be, for example, aluminum balls or balls of another suitable conductive material for use with a BGA and a PCB. In some embodiments, terminals 116 are solder-coated or Sn-coated. Terminals 116 may be positioned on the lower surface of substrate 104 around the perimeter of processor die 106 and/or voltage regulator 114. Having terminals 116 on the perimeter allows at least a portion of processor die 106 and/or at least a portion of voltage regulator 114 to be positioned in recess 103 in board 102. Positioning at least a portion of processor die 106 and/or at least a portion of voltage regulator 114 in recess 103 reduces the overall height of the semiconductor package (e.g., the height of package 100 above board 102 is reduced). The height of package 100 above board 102 is reduced even with the presence of heat sink material 112 because of recess 103.

Figure 2:
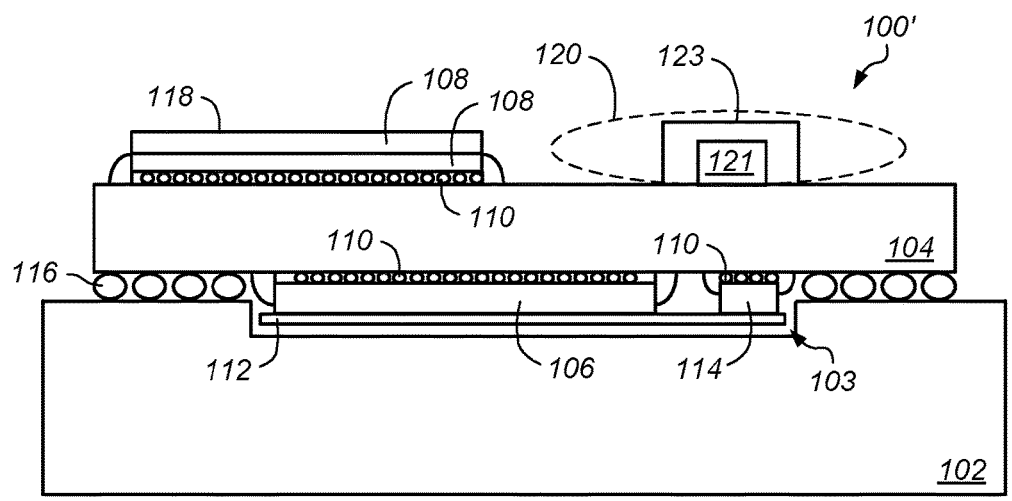
FIG. 2 depicts a side-view representation of another embodiment of semiconductor package coupled to a board.

FIG. 2 depicts a side-view representation of another embodiment of semiconductor package 100' coupled to board 102. Package 100' is substantially similar to package 100, depicted in FIG. 1, except that memory die 108 are coupled to substrate 104 as memory die stack 118. In certain embodiments, stack 118 includes two memory die 108 coupled together and stacked using through-silicon vias (TSVs). Stack 118 may be coupled to substrate 104 using terminals 110.

Figure 3:
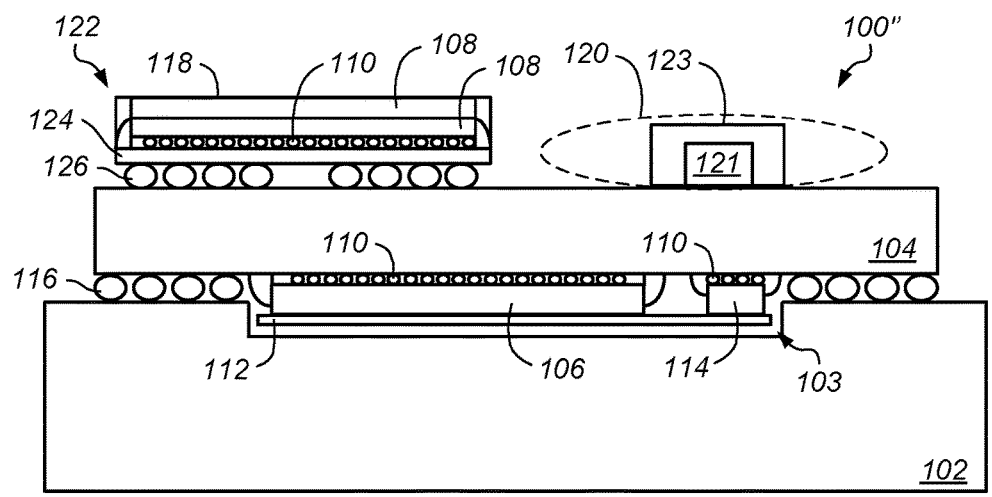
FIG. 3 depicts a side-view representation of yet another embodiment of a semiconductor package coupled to a board.

FIG. 3 depicts a side-view representation of yet another embodiment of semiconductor package 100" coupled to board 102. Package 100" is substantially similar to package 100', depicted in FIG. 2, except that memory die 108 are placed in chip scale package (CSP) 122. In certain embodiments, CSP 122 includes memory die stack 118 coupled to CSP substrate 124 using terminals 110. CSP 122 may be coupled to substrate 104 using terminals 126. Stacking memory die 108, as shown in FIGS. 2 and 3, may reduce the width of memory die 108 on the upper surface of substrate 104 while adding some additional height to the semiconductor package (e.g., package 100' or package 100") above board 102.

In certain embodiments, stacking memory die 108 in stack 118 (and/or CSP 122) may create open area 120 on the upper surface of substrate 104. In some embodiments, open area 120 is used as an area for coupling passives 121 for a power delivery system 123 (such as inductors or capacitors) to substrate 104. The passives 121 may be mounted, for example, using surface-mount technology (SMT). The passives 121 may be used to provide power to memory die 108 and/or processor die 106. In some embodiments, the passives 121 are used in combination with voltage regulator 114.

Figure 4:
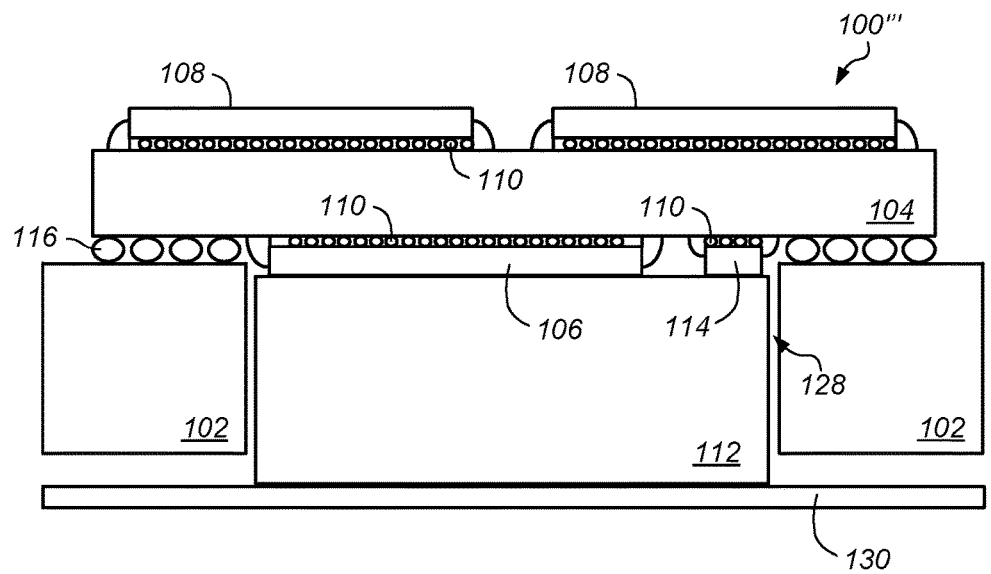
FIG. 4 depicts a side-view representation of an embodiment of a semiconductor package coupled to a board with a hole through the board.

In certain embodiments, a hole is formed through a printed circuit board (e.g., board 102) and to allow the thermal solution (e.g., the heat sink material) to pass through the printed circuit board. FIG. 4 depicts a side-view representation of an embodiment of semiconductor package 100''' coupled to board 102 with hole 128 through the board. Hole 128 may be formed, for example, by removing portions of board 102 using, for example, etching techniques known in the art such as laser etching.

As shown in FIG. 4, forming hole 128 in board 102 allows heat sink material 112 to pass through the board. In certain embodiments, heat sink material 112 protrudes beyond the lower surface of board 102. In some embodiments, heat sink material 112 is flush with the lower surface of board 102. Forming hole 128 in board 102 allows heat sink material 112 to have a large volume and/or to conduct heat to another material. For example, heat sink material 112 may be coupled to metal base 130 or another thermally conductive base material.

Packages 100, 100', 100", 100''' (depicted in FIGS. 1-4) have reduced heights as compared to PoP packages that include both processor die (such as an SoC) and memory die (such as a DRAM). PoP packages typically have heights of at least about 1.2-1.3 mm above the PCB or motherboard. Packages 100, 100', 100", and 100''' may have heights between about 0.4 mm and about 0.8 mm above board 102 or heights between about 0.6 mm and about 0.8 mm above board 102. Thus, as an example, using a 10 layer PCB would give a total semiconductor package height (board plus process/memory die package) of between about 1.4 mm and about 1.6 mm. In addition, packages 100, 100', 100", and 100''' may have reduced x- and y-dimensions (area) as compared to PoP packages as there is a reduced need for fan-out or other wafer level packaging techniques that increase the area of the package on the PCB or motherboard.

Additionally, packages 100, 100', 100", and 100''' thermally separate memory die 108 from processor die 106 using substrate 104. Separating memory die 108 from processor die 106 using substrate 104 allows the memory die to operate at cooler temperatures and reduces throttling of the memory die to inhibit over-temperature in the memory die. Thus, memory die 108 may operate at faster speeds than in current package layouts (e.g., PoP packages). In certain embodiments, separating memory die 108 from processor die 106 using substrate 104 at least doubles the operating speed of the memory die as compared to a memory die in a PoP package. In addition, thermally separating memory die 108 from processor die 106 allows thermal solutions (e.g., heat sink materials) to be applied to either or both die, which increases thermal mass and provides a conduit for spreading and dissipating heat that is not typically possible using PoP packages.

Packages 100, 100', 100", and 100''' also include processor die 106 coupled to heat sink material 112. Heat sink material 112 may thermally couple processor die 106 (and/or voltage regulator 114) to board 102. The presence of heat sink material 112 may improve heat dissipation from processor die 106 and increase the speed of the processor die by reducing throttling of the processor die due to over-temperature concerns.

In this patent, certain U.S. patents, U.S. patent applications, and other materials (e.g., articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the embodiments described herein will be apparent to those skilled in the art in view of this description. Accordingly, this description is to be construed as illustrative only and is for the purpose of teaching those skilled in the art the general manner of carrying out the embodiment described herein. It is to be understood that the forms of the embodiments shown and described herein are to be taken as the presently preferred embodiments. Elements and materials may be substituted for those illustrated and described herein, parts and processes may be reversed, and certain features of the described embodiments and other embodiments not necessarily described herein may be utilized independently, all as would be apparent to one skilled in the art after having the benefit of this description. Changes may be made in the elements described herein without departing from the spirit and scope as described in the following claims.

What is claimed is:

1. A semiconductor device package assembly, comprising:
    a circuit board comprising a recess in an upper surface of the circuit board;
    a substrate coupled to the upper surface of the circuit board;
    a processor die coupled to a lower surface of the substrate, the processor die being positioned between the lower surface of the substrate and the circuit board, wherein at least a portion of the processor die is positioned in the recess in the upper surface of the circuit board; and
    a voltage regulator coupled to the lower surface of the substrate, the voltage regulator being positioned between the lower surface of the substrate and the circuit board, wherein:
    at least a portion of the voltage regulator is positioned in the recess in the upper surface of the circuit board;
    at least one memory die coupled to an upper surface of the substrate; and
    one or more passive devices coupled to the upper surface of the substrate, wherein at least one of the passive devices provides power to the at least one memory die.

2. The assembly of claim 1, wherein the voltage regulator is electrically coupled to the processor die, the voltage regulator providing power to the processor die.

3. The assembly of claim 1, further comprising a heat sink material positioned in the recess in the upper surface of the circuit board, wherein the heat sink material is attached to both a lower surface of the processor die and a lower surface of the voltage regulator.

4. The assembly of claim 1, wherein the substrate comprises a ball grid array substrate.

5. The assembly of claim 1, wherein the voltage regulator is electrically coupled to the processor die and the at least one memory die, the voltage regulator providing power to the processor die and the at least one memory die.

6. The assembly of claim 1, wherein the voltage regulator is electrically coupled to the processor die and the at least one memory die, the voltage regulator and one or more of the passive devices providing power to the processor die and the at least one memory die.

7. The assembly of claim 1, wherein the at least one memory die comprises a chip scale package of at least two memory die, and wherein the chip scale package comprises a chip scale package substrate coupled the upper surface of the substrate.

8. A semiconductor device package assembly, comprising:
- a circuit board comprising a recess in an upper surface of the circuit board;
- a substrate coupled to the upper surface of the circuit board;
- a processor die coupled to a lower surface of the substrate, the processor die being positioned between the lower surface of the substrate and the circuit board, wherein at least a portion of the processor die is positioned in the recess in the upper surface of the circuit board;
- at least one memory die coupled to an upper surface of the substrate; and
- a power delivery system coupled to the substrate, the power delivery system comprising one or more passive devices coupled to the upper surface of the substrate and a voltage regulator coupled to the lower surface of the substrate, wherein the power delivery system is electrically coupled to the processor die and the at least one memory die to provide power to the processor die and the at least one memory die.

9. The assembly of claim 8, wherein the power delivery system provides power to the processor die and the at least one memory die using a combination of the passive devices and the voltage regulator.

10. The assembly of claim 8, wherein the voltage regulator is positioned between the lower surface of the substrate and the circuit board.

11. The assembly of claim 8, wherein at least a portion of the voltage regulator is positioned in the recess.

12. The assembly of claim 8, further comprising a heat sink material positioned in the recess in the upper surface of the circuit board, wherein the heat sink material is attached to both a lower surface of the processor die and a lower surface of the voltage regulator.

13. The assembly of claim 8, wherein the power delivery system provides power to the at least one memory die using at least one of the passive devices.

14. The assembly of claim 8, wherein the at least one memory die comprises a chip scale package of at least two memory die, and wherein the chip scale package comprises a chip scale package substrate coupled the upper surface of the substrate.

15. A semiconductor device package assembly, comprising:
- a circuit board;
- a substrate coupled to an upper surface of the circuit board;
- a processor die coupled to a lower surface of the substrate, the processor die being positioned between the lower surface of the substrate and the circuit board;
- one or more passive devices coupled to an upper surface of the substrate;
- one or more memory die coupled to the upper surface of the substrate; and
- a voltage regulator coupled to the lower surface of the substrate;
- wherein the processor die is electrically coupled to the voltage regulator and at least one of the passive devices, the voltage regulator and the at least one passive device providing power to the processor die; and
- wherein at least one of the passive devices is electrically coupled to and provides power to at least one of the memory die.

16. The assembly of claim 15, wherein the one or more memory die comprises at least two memory die in a stacked configuration.

17. The assembly of claim 15, further comprising a recess in the upper surface of the circuit board, at least a portion of the processor die being positioned in the recess.

18. The assembly of claim 15, further comprising a heat sink material positioned in a recess in the upper surface of the circuit board, wherein the heat sink material is attached to both a lower surface of the processor die and the voltage regulator.

19. The assembly of claim 15, wherein the voltage regulator is electrically coupled to and provides power to at least one of the memory die in combination with the at least one passive device.

20. The assembly of claim 17, wherein at least a portion of the voltage regulator is positioned in the recess.

* * * * *